(12) United States Patent
Federspiel

(10) Patent No.: US 8,237,458 B2
(45) Date of Patent: Aug. 7, 2012

(54) ELECTROMIGRATION TESTING AND EVALUATION APPARATUS AND METHODS

(75) Inventor: Xavier Federspiel, Grenoble (FR)

(73) Assignee: NXP B.V., Eindhoven (NL)

( * ) Notice: Subject to any disclaimer, the term of this patent is extended or adjusted under 35 U.S.C. 154(b) by 419 days.

(21) Appl. No.: 12/594,212

(22) PCT Filed: Mar. 27, 2008

(86) PCT No.: PCT/IB2008/051154
§ 371 (c)(1),
(2), (4) Date: Oct. 1, 2009

(87) PCT Pub. No.: WO2008/120151
PCT Pub. Date: Oct. 9, 2008

(65) Prior Publication Data
US 2010/0127719 A1 May 27, 2010

(30) Foreign Application Priority Data
Apr. 2, 2007 (EP) .................................... 07290395

(51) Int. Cl.
*G01R 27/08* (2006.01)

(52) U.S. Cl. ... 324/713; 324/527; 324/722; 324/750.06; 257/48

(58) Field of Classification Search .................. 257/767, 257/48, 18; 438/468, 927; 324/527, 713, 324/722, 750.06; 716/115
See application file for complete search history.

(56) References Cited

U.S. PATENT DOCUMENTS

| | | | |
|---|---|---|---|
| 5,497,076 A * | 3/1996 | Kuo et al. | 324/762.02 |
| 6,867,056 B1 * | 3/2005 | Hau-Riege et al. | 438/17 |
| 2006/0125494 A1 * | 6/2006 | Von Hagen | 324/722 |

FOREIGN PATENT DOCUMENTS
WO 04/001432 A 12/2003

OTHER PUBLICATIONS

Impronta, M., et al; "Resistance Instability in CU-Damascene Structures During the Isothermal Electromigration Test"; Integrated Reliabiity Workshop Final Report; 2005 IEEE International; South Lake Tahoe, CA, US; Oct 17-20, 2005; Piscataway, NJ, US; pp. 135-138; XP010911023; ISBN: 0-7803-8992-1.

* cited by examiner

*Primary Examiner* — Timothy J Dole
*Assistant Examiner* — Son Le

(57) ABSTRACT

The present invention relates to electromigration testing and evaluation methods and apparatus for a device under test with an interconnect structure. The method comprises forcing the occurrence of a step resistance-increase of the interconnect structure due to electromigration in the first layer and subsequently subjecting the interconnect structure to at least three respective predetermined stress conditions while concurrently measuring a test quantity indicative of an electrical resistance of the interconnect structure. The method allows performing an electromigration test in much shorter time than known electromigration testing methods, without loss of information or accuracy. It is therefore possible to accelerate the optimization of the interconnect manufacturing process so that the conductor electromigration kinetics remains compatible with a required product lifetime. This allows reducing the time and cost for electromigration testing and thus fabricating integrated-circuit devices with a lower overall cost.

20 Claims, 6 Drawing Sheets

ELECTROMIGRATION TESTING AND EVALUATION APPARATUS AND METHODS

FIELD OF THE INVENTION

The present invention relates to an electromigration testing method and apparatus and an electromigration evaluation method and apparatus.

BACKGROUND OF THE INVENTION

In the fabrication of integrated circuits, individual devices such as transistors on a wafer are connected by interconnect structures to perform desired functions of the integrated circuits. The interconnect structures are typically arranged on different interconnect levels, which are connected through vias.

Electromigration in interconnect structures of integrated-circuits is known as an atomic movement (flux) of conductor material due to electric current flow. It is observed to occur at rather high current densities. Under a high current density, atoms constituting the interconnect structure are pushed by traveling electrons, so that a constant flux of matter is generated. This flux will remain constant, unless a discontinuity is encountered. A flux divergence is likely to induce a depletion (void) or a accumulation of conductor material.

Electromigration is thus known to cause a nucleation and growth of voids in the interconnect structure. Void formation is particularly strong near an interface between an interconnect and a via. Here, a high flux divergence coincides with a position where maximum current density occurs. Over time, a small void grows into a larger void due to continued atomic movement of conductor material. With an increase in void size, an increased electrical resistance is observed. Large enough voids can lead to open circuits, causing the integrated circuit to fail.

The development of a new technology node in the fabrication of integrated circuits includes reliability assessments, among which electromigration tests represent a major challenge. As a matter of fact, it is necessary to optimize every step of the interconnect manufacturing process so that the conductor electromigration kinetics remains compatible with a required product lifetime.

Therefore, electromigration tests are performed on packaged samples submitted to stress conditions of temperature and/or current density that are significantly more stringent than those corresponding to operating conditions. Then, the evolution of a mean time to fail (MTF) in dependence of current or temperature, as determined from the tests, allows deriving a current density exponent n and an activation energy $E_a$ according to Black's equation, which is commonly used to extrapolate the electromigration lifetime under operation conditions.

One variant of Black's equation reads:

$$MTF = A \cdot w \cdot t \cdot j^{-n} \cdot \exp\left(\frac{E_a}{kT}\right) \qquad (1)$$

with the following meaning of the symbols used:
MTF is the mean time-to-fail, A is an "acceleration factor" (constant), w is a lateral width of the interconnect structure, as measured in a direction perpendicular to a main current direction through the interconnect structure, t is a thickness of interconnect line, j is a current density (A/cm$^2$), n is the current density exponent, $E_a$ is the activation energy, k is Boltzmann's constant, T is the temperature in Kelvin.

SUMMARY OF THE INVENTION

According to a first aspect of the invention, an electromigration testing method for a device under test with an interconnect structure is provided. The method comprises:
  subjecting, for a first stress time span, the interconnect structure to a first stress condition, which comprises a first electrical current density in the interconnect structure and a first temperature of the interconnect structure, so as to force occurrence of a step resistance-increase of the interconnect structure due to electromigration in the first layer; and
  subjecting the interconnect structure to at least three respective predetermined stress conditions, which differ from each other in their value of the electrical current density in the interconnect structure or of the temperature of the interconnect structure, for at least three respective stress time spans after the occurrence of the step resistance-increase, and concurrently measuring a test quantity indicative of an electrical resistance of the interconnect structure.

The method is based on the recognition that, on one side, an activation energy governing the value of a mean or median time-to-failure (MTF) due to electromigration according to Black's equation and, on the other side, an activation energy governing the diffusion of conductor material in an interconnect structure due to electromigration are the same.

This recognition is thus to advantage for an electromigration testing method that comprises measuring a quantity, which is indicative of electromigration-induced conductor-material diffusion.

The method is particularly suitable for a device under test (DUT) with an interconnect structure that has a parallel connection of electrical resistances in the form of an electrically conductive first layer and an adjacent electrically conductive second layer. The first or second layers may also take the form of layer stacks comprising more than one respective layer. Such devices under test form the vast majority of application cases. Integrated-circuit devices with an interconnect structure that comprises the first layer in form of a metallization layer and the adjacent second layer in form of a barrier layer form an important example of suitable devices under test. The barrier function for instance includes the prevention of diffusion of conductor material from the metallization layer into neighboring structural elements, such as dielectric layers, or into other layers of the integrated-circuit device. Most integrated-circuit devices fabricated with advanced back-end-of-line (BEOL) processing technologies thus fall under this category. For instance, integrated-circuit devices with a Cu-based damascene or dual damascene interconnect stack typically have this structure.

With the nucleation of a void in the first layer, the electrical resistance of the interconnect structure in the section of the void exhibits a step resistance-increase, but not to an infinite value. Afterwards, under continued stress, the resistance increases progressively according to the progress of electromigration-induced conductor-material diffusion leading to a one-dimensional growth of the void in the first layer. The electromigration testing method of the invention comprises measuring a quantity indicative of this increasing resistance during at least three respective stress time spans after the occurrence of the step resistance-increase. This way, deriving the electromigration characteristics of the DUT is made possible.

Consequently, it is not necessary to wait for a long test time at low temperature or low current density to determine the TTF, which corresponds to the time span required until reaching the step-shaped resistance-increase. The step resistance-increase can be forced to occur fast under a correspondingly stringent first stress condition, because the actual testing only starts afterwards. In particular, the method allows using one and the same first stress condition for all devices under test in the parallel testing of a large number of samples. For key information required for determining electromigration parameters is in this method obtained after the TTF, i.e., after the step-resistance increase. Thus, it becomes possible to let the duration of the electromigration testing not depend on the longest TTF within the group of devices under test, but, in practice, on a testing procedure after TTF. The electromigration testing method achieves testing times, which are shorter by a factor of at least 5 in comparison with electromigration testing methods that measure the TTF.

The use of three different stress conditions in the electromigration testing method allows determining three electromigration parameters of Black's equation: the activation energy $E_a$ governing the MTF (by means of determining the activation energy governing electromigration induced conductor-material diffusion at a void), the current density exponent n, and the acceleration factor A, as will be explained in more detail in the context of embodiments of the method.

In summary, the method allows performing an electromigration test in much shorter time than known electromigration testing methods, without loss of information or accuracy. It is therefore possible to accelerate the optimization of the interconnect manufacturing process so that the conductor electromigration kinetics remains compatible with a required product lifetime. This allows reducing the time and cost for electromigration testing and thus fabricating integrated-circuit devices with a lower overall cost.

In the following, embodiments of the electromigration testing method will be described. The embodiments can be combined with each other, unless stated otherwise explicitly.

Subjecting the interconnect structure to at least three respective stress conditions, which differ from each other in their values of the electrical current density in the first layer or of the temperature of the interconnect structure comprises as different alternatives, that either
a) Two or all at least three respective stress conditions differ from each other only in their values of the electrical current density in the first layer, or
b) Two or all at least three stress conditions differ from each only in their values of the temperature of the interconnect structure, or that
c) both parameters, current density and temperature, vary between at least two of the three stress conditions.

The electromigration testing method allows using only one sample instead of multiple samples for ascertaining the activation energy with comparable accuracy in comparison to the prior art, which requires the determination of the MTF of an interconnect structure from a large number of samples.

However, in some embodiments, a plurality of DUTs is tested in parallel. Performing the method for a plurality of devices under test in parallel achieves better statistical reliability. One such embodiment comprises measuring respective time-to-fail values for the devices under test as the respective time spans from a beginning of the first stress time span to the occurrence of the electromigration-induced step resistance-increase of the interconnect structure. This is useful for evaluating the current-density exponent.

An embodiment that applies electromigration testing to many DUTs in parallel preferably comprises
  performing the method on different electromigration testing apparatus in parallel;
  providing measured test quantity values obtained from the plurality of samples from the different electromigration testing apparatus to a single evaluation stage.

This embodiment achieves a particularly short testing time and allows reducing the cost for testing and evaluation.

To achieve particularly short testing times, the first temperature value of the first stress conditions is chosen higher than any of the temperature values used in the stress conditions after occurrence of the step-resistance change, and, as an alternative or in combination with that, the first current density value of the first stress conditions is higher than any of the current density values used in the stress conditions after occurrence of the step-resistance change. This embodiment has the advantage that the first stress time span can be made particularly short. Thus, the step resistance-increase is preferably forced by using a most accelerated stress condition, followed by subsequent stress conditions with reduced temperature and/or current.

Note that instead of the electrical resistance as the test quantity any detectable quantity can be measured in the electromigration testing method, if that detectable quantity is in a known relationship with the electrical resistance of the interconnect structure. A suitable alternative test quantity is the electrical conductance, which is the inverse of the electrical resistance.

In one embodiment of the electromigration testing method, subjecting the interconnect structure to at least three stress conditions after the occurrence of the step resistance-increase comprises subjecting it to at least three different temperature values. This allows determining a temperature dependence of the change rate of the electrical resistance after the step resistance-increase. From the temperature dependence, the activation energy $E_a$ can be determined, as will be described further below.

In another embodiment subjecting the interconnect structure to at least three stress conditions after the occurrence of the step resistance-increase comprises varying only the current density and maintaining a fixed temperature value for at least two stress conditions. This embodiment is suitable for ascertaining the current density exponent n. This embodiment can be implemented as an alternative to the previous embodiment, which comprises the use of three different temperatures in the three stress conditions after the occurrence of the step resistance-increase. However, the present embodiment can also be implemented in combination with that embodiment in that both parameters are changed at the same time when varying the stress condition or in that more than three different stress conditions are used, some varying only a temperature for a fixed current density, and some varying only a current density for a fixed temperature.

The electrical current density can for instance be varied by varying the electrical current in the interconnect structure.

A further embodiment of the electromigration testing method comprises
  detecting that the test quantity exhibits a relative change higher than a threshold relative-change within a time window extending from a respective present point in time back for a predetermined time span; and
  either stopping the electromigration testing or changing to a next stress condition for continuing the electromigration testing, depending on whether a preset number of stress conditions has been reached or not, respectively.

This method allows achieving a reliable step detection and applying a criterion for a suitable stress time span after the occurrence of the step resistance-increase based on the same technique. Only the parameters of the relative change and of the time window used for detecting step need to be changed between the phases before and after the occurrence of the step resistance-increase. Before, the time window is preferably a moving time window. After the occurrence of the step resistance-increase, the time window suitably has a fixed starting point, which is the beginning of a respective stress time span.

The step-resistance increase referred to in the description and the claims is typically detected as a relative increase of the electrical resistance, which is persistent, i.e., not reversed, and occurs within a short time span (time window). Suitable values of a threshold relative-increase depend on the desired accuracy of determination of electromigration parameters. A relative threshold increase of between 1 to 5% can be sufficient for detection of a step-resistance increase. In one embodiment, the threshold is 10%. A suitable threshold depends on the first stress condition. The more stringent it is, the higher can the threshold be set. A suitable time window used for detection of a step resistance-increase is in one embodiment 5000 seconds. This time window or even shorter time windows should be considered a short time span in the present context. Small time windows can be used for step detection if the first stress condition used to force the occurrence of the step resistance-increase is correspondingly stringent.

According to a second aspect of the invention, a method for electromigration evaluation of a device under test with an interconnect structure is provided. The method comprises the steps:

providing measurement data of a test quantity indicative of an electrical resistance of the interconnect structure obtained by performing an electromigration testing method according to the first aspect of the invention or one of its embodiments;

providing data indicative of applied stress conditions and respective stress time spans used in performing the electromigration testing method according to the first aspect of the invention or one of its embodiments;

ascertaining respective change rates of the electrical resistance of the interconnect structure of the device under test under the at least three respective stress conditions applied during the at least three respective stress time spans after the occurrence of the step resistance-increase.

The electromigration evaluation method of the second aspect of the invention shares its concept and advantages with the electromigration testing method of the first aspect of the invention.

The electromigration evaluation method of the invention is a method to be performed by electromigration evaluation apparatus, be it an independent device or a device that is structurally integrated into an electromigration testing apparatus. Accordingly, the electromigration evaluation method is in one embodiment performed in combination with the electromigration testing method of the first aspect of the invention, either in parallel with the testing or after the testing. However, the method of the second aspect of the invention need not be performed at the same time or at the same place as the electromigration testing method of the first aspect of the invention, and does not require a structural integration of electromigration testing and evaluation apparatus. The electromigration testing can be performed at one facility at one end of the world, while the electromigration evaluation can be performed at another facility at another end of the world.

The method of the second aspect of the invention makes use of the recognition that the activation energy of electromigration-induced conductor-material diffusion at the void is related to the resistance change rate. This method can be used to determine different electromigration parameters in further evaluation steps, as will be described in more detail with reference to further embodiments of the electromigration testing method below.

A resistance change rate can for instance be determined as a slope of a linear fit to a measured resistance trace over the respective stress time span. In this embodiment, the respective stress time spans are preferably chosen long enough to allow ascertaining a respective change rate of the electrical resistance for the respective stress conditions for achieving a desired or predetermined accuracy in the determination of the resistance change rate.

The method further comprises in one embodiment an ascertaining of an activation energy of electromigration-induced conductor-material diffusion from the change rates of the test quantity as a function of the testing temperature or as a function of the current density. As was explained before, the activation energy of electromigration-induced conductor-material diffusion is identical with the activation energy of a mean time-to-failure do to electromigration according to Black's equation.

In the presence of a void generated by electromigration-induced conductor-material diffusion in the first layer, i.e., after TTF, the electrical resistance of the interconnect structure changes with a rate $$\frac{\Delta R}{\Delta t}$$

that depends on the stress condition, in particular, on the temperature and the current density. One embodiment therefore comprises ascertaining or providing, for the device under test, data indicative of a resistivity $\rho_b$ of the material of a second layer in a parallel connection of electrical resistances in the form of an electrically conductive first layer and an adjacent electrically conductive second layer, a layer thickness $t_b$ of the second layer, a lateral width w of the first layer, as measured in a direction perpendicular to a main current direction through the interconnect structure, and a layer thickness h of the first layer, as measured in a direction perpendicular to a main surface of the integrated circuit device.

Such data is typically available from physical layout data of an interconnect structure of a respective DUT, or from independent measurements and evaluations.

In this embodiment, the step of ascertaining the activation energy of electromigration-induced conductor-material diffusion comprises calculating the activation energy on the basis of the following relation from the change rates determined for the at least three respective different stress conductions after the step resistance-increase:

$$\ln\left(\frac{\Delta R}{\Delta t}\right) = \ln\rho_b + \ln A + \ln j - n \cdot \ln(w \cdot 2 \cdot t_b + 2 \cdot h \cdot t_b) - \ln\Delta t + \frac{-E_a}{kT} \quad (2)$$

Here, $$\frac{\Delta R}{\Delta t}$$

is a resistance change rate, $\Delta t$ is a respective stress time span, A is a constant, $\rho_b$ is the resistivity of the material of the second layer, j is the current density in the interconnect structure, $E_a$ is the activation energy, k is Boltzmann's constant, T is the temperature of the interconnect structure. The evaluation of the activation energy can thus be performed as a linear fit to a representation of the resistance change rate corresponding to an Arrhenius plot.

This equation is based of the following relation between the change rate and the other cited quantities:

$$\frac{\Delta R}{\Delta t} = \rho_b \frac{v_d}{w \cdot 2t_b + 2 \cdot h \cdot t_b} = \rho_b \frac{A \cdot j \cdot \exp\left(-\frac{E_a}{kT}\right)}{w \cdot 2t_b + 2 \cdot h \cdot t_b} \quad (3)$$

In equation (3), the constant A includes a diffusivity constant to express the drift velocity $v_d$, i.e., the void growing speed in units of length over time.

One embodiment comprises
providing measurement data of a test quantity indicative of an electrical resistance of the interconnect structure obtained from an electromigration testing, thus including varying only the current density and maintaining a fixed temperature value for at least two stress conditions, thus comprising performing the method for a plurality of devices under test in parallel and measuring respective time-to-fail values for the devices under test as the respective time spans from a beginning of the first stress time span to the occurrence of the electromigration-induced step resistance-increase of the interconnect structure;

ascertaining a mean time-to-failure from measured time-to-fail values of the devices under test;

ascertaining a current-density exponent n according to Black's equation from the change rates of test quantity as a function of the current density and the ascertained activation energy for the fixed temperature value.

In this embodiment, in addition to the activation energy, the current-density exponent n according to Black's equation is determined to complement the electromigration characteristics. Since a stringent first stress condition can be used to force the fast occurrence of the step-resistance increase, no increase of total testing time is required. The step of ascertaining the current-density exponent can for instance be based on the following relation that is easily derived from Blacks's equation:

$$\ln(MTF) \propto \frac{E_a}{kT} \cdot n \cdot \ln j \quad (4)$$

The parameters mentioned in this equation have been defined in previous sections of the description. Given the knowledge of the activation energy and of a particular temperature, which is fixed for at least two stress conditions, the current-density exponent n can thus be determined from the slope of logarithmic plot of the distribution of the MTF as a function of the natural logarithm of the current density.

Note that the current density exponent n can also be included in equation (2), since TTF can also, under given assumptions, be related to a copper diffusion flux, i.e., $v_d$ and; thus, the resistance increase rate.

According to a third aspect of the invention, an apparatus is provided for electromigration testing of a device under test. The apparatus is configured to
subject, for a first stress time span, the interconnect structure to a first stress condition, which is defined by a first electrical current density in the interconnect structure and a first temperature of the interconnect structure, so as to force an electromigration-induced step resistance-increase of the interconnect structure; and to
subject the interconnect structure to at least three predetermined respective stress conditions, which differ from each other in their value of the electrical current density or of the temperature, for at least three respective stress time spans after the occurrence of the step resistance-increase.

The apparatus implements an electromigration testing method according to the first aspect of the invention. It therefore shares the advantages described above for that method. The apparatus is particularly suitable for testing DUTs with an interconnect structure that has a parallel connection of electrical resistances in the form of an electrically conductive first layer and an adjacent electrically conductive second layer.

In the following, preferred embodiments of the apparatus of the second aspect of the invention will described. The embodiments can be combined with each other to form additional embodiments.

One embodiment has
a step-detector unit, which is configured to detect a change of the first quantity corresponding to a step resistance-increase and to provide at its output a trigger signal indicative of the occurrence of the step resistance-increase; and
a stress-control unit, which has an input connected with the step-detector unit and which is configured to generate and provide at its output, after having received the trigger signal, respective stress-control signals for setting or maintaining the respective predetermined electrical currents and for setting or maintaining a respective predetermined temperatures for the respective stress time spans after the occurrence of the step resistance-increase.

Suitably, the electromigration testing apparatus further comprises
a current-stress unit, which is connected with the stress-control unit and which is configured to provide at its output an electrical current suitable for providing a predetermined electrical current density in an interconnect structure of a device under test; and
a temperature-stress unit, which is configured provide at its output an amount of heat energy suitable for to setting or maintaining a predetermined temperature of the interconnect structure of the device under test.

Furthermore, a monitoring unit is preferably provided, which is configured to measure a test quantity indicative of an electrical resistance of the interconnect structure and to save measured test-quantity values in a measurement memory.

According to a fourth aspect of the invention, an apparatus for electromigration evaluation of a device under test is provided, the apparatus being configured to:
receive measurement data of a test quantity indicative of an electrical resistance of the interconnect structure obtained by performing an electromigration testing method according to the first aspect of the invention or one of its embodiments;
receive data indicative of applied stress conditions and respective stress time spans used in performing the electromigration testing to the method of the first aspect of the invention or one of its embodiments; and to
ascertain respective change rates of the electrical resistance of the interconnect structure of the device under test under the at least three respective stress conditions applied during the at least three respective stress time spans after the occurrence of the step resistance-increase.

The apparatus of the fourth aspect of the invention implements is suitable for implementing the electromigration evaluation method of the second aspect of the invention.

In additional embodiments, the apparatus is additionally configured to provide one or more of the following functionalities:

- ascertain an activation energy of electromigration-induced conductor-material diffusion from the change rates of the test quantity as a function of the testing temperature or as a function of the current density;
- measure a respective time-to-fail value for a device under test as the respective time span from a beginning of the first stress time span to the occurrence of the electromigration-induced step resistance-increase of the interconnect structure; and
- ascertain a mean time-to-failure from measured time-to-fail values of the devices under test;
- ascertain a current-density exponent n according to Black's equation from the change rates of test quantity as a function of the current density and the ascertained activation energy.

Two further aspects of the invention relate to
- a first computer program product, carrying a computer program embodied in a computer readable medium adapted to perform an electromigration testing method according to the first aspect or one of its embodiments described herein when implemented on a computer, and to
- a second computer program product, carrying a computer program embodied in a computer readable medium adapted to perform an electromigration evaluation method according to the second aspect of the invention or one of its embodiments when implemented on a computer.

Further embodiments of the invention are defined in the dependent claims.

BRIEF DESCRIPTION OF THE DRAWINGS

The invention will now be explained in more detail with reference to the drawings in which.

DETAILED DESCRIPTION OF EMBODIMENTS

Figure 1:
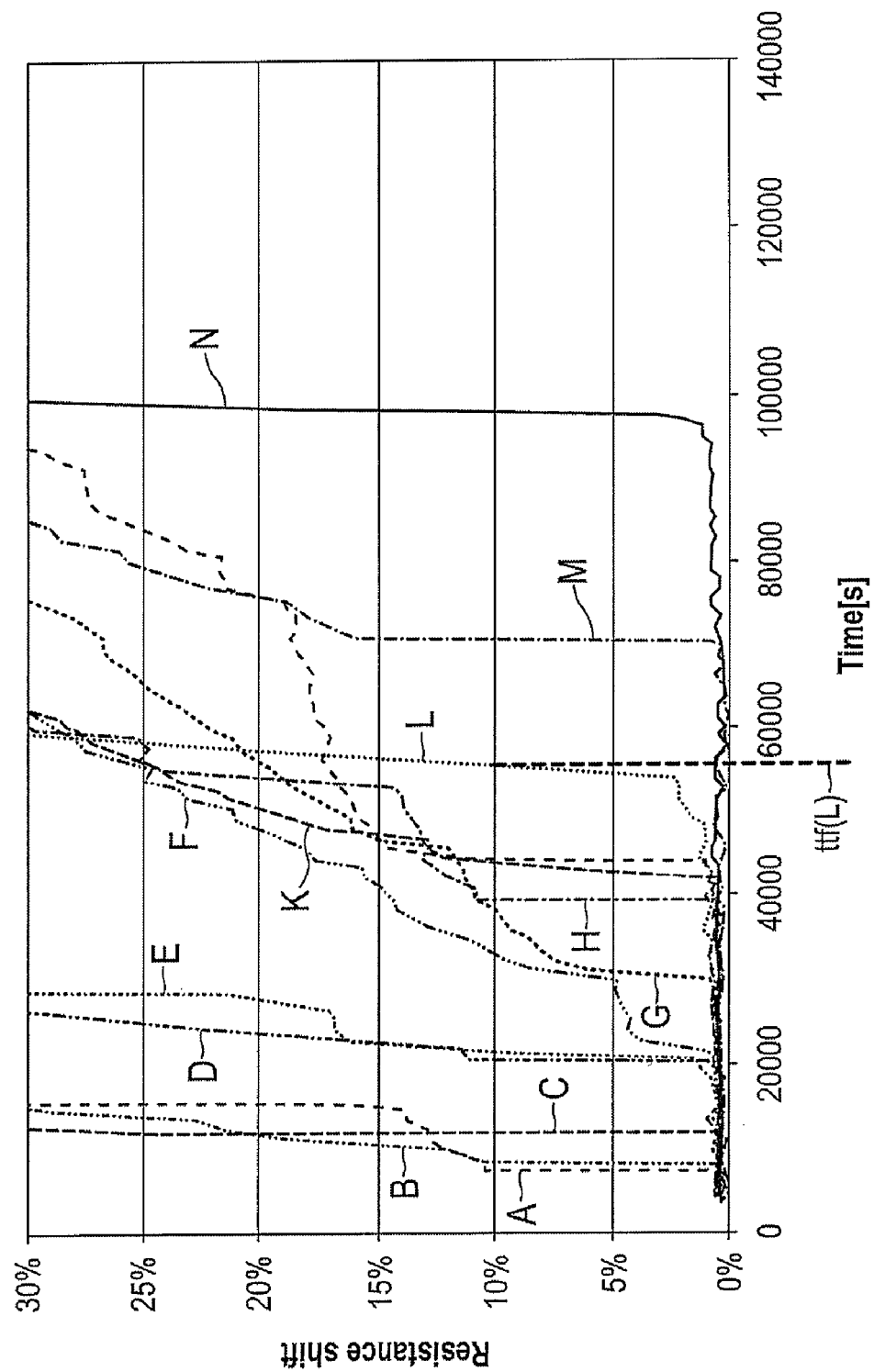
FIG. 1 shows a diagram illustrating the evolution of the electrical resistance in time under exemplary stress conditions for a number of samples of a specific wafer lot.

FIG. 1 shows a diagram illustrating the evolution of the electrical resistance of an interconnect structure in time under exemplary stress conditions for a number of nominally identical samples taken from a specific wafer lot.

The resistance change is plotted on the y-axis in relative units between 0 and 30%. On the x-axis, the time is plotted in units of seconds.

For the resistance measurements, which are shown in FIG. 1, the samples were all subjected to stress conditions formed by a temperature of 300° C. and a current density of 1.5 MA/cm$^2$ in the interconnect structure. Each resistance trace plotted in the diagram of FIG. 1 corresponds to one sample.

It is clearly visible from FIG. 1 that the different samples exhibit quite different time-to-failure (TTF) values. The TTF refers to the time span from the beginning of the measurement to reaching a step resistance increase. Some samples exhibit a TTF value, which is lower than 10 000 seconds. Exemplary resistance traces for this group are marked with reference labels A and B. A majority of samples under study in FIG. 1 exhibit a TTF between 20000 and 60000 seconds. These traces are marked with letters D through L in FIG. 1. The longest TTF observed in the group of samples is approximately 95 000 seconds, corresponding to more than 26 hours, as observed for resistance trace N.

This variation of the TTF between different samples is assigned to a natural spread of electromigration parameters and void shapes in the interconnect structures.

To asses accurately the shape of the TTF distribution, a large number of samples has to be evaluated in order to obtain a reliable mean TTF value. Furthermore, different samples have to be subjected to different current densities and different temperatures. Still, however, the extrapolation of the lifetime from failure-accelerating stress conditions to operating conditions of products according to the prior art is facing several limitations.

First, the number of metal lines that potentially present a risk versus electromigration in a circuit amounts to several tenth of thousands. Therefore, it is necessary to tests numerous samples in order to obtain a good fit of the cumulative distribution of the TTF and to extrapolate 1 ppm product fails. This is particularly hard to achieve when for instance the cumulative distribution of failure is multimodal. In this case, the electromigration parameters $E_a$ and n must be determined for each failure mode separately.

Second, the accuracy of the determination of the electromigration parameters $E_a$ and n is a function of the range of stress temperature and current density covered during the test procedure. To avoid a change in the failure mode, the maximum stress temperature and current density are typically limited to 325° Celsius (C.) and 3 MA/cm$^2$, respectively. It is then required to run tests at temperatures as low as 220° C. to correctly determine temperature acceleration. Testing at low temperatures, however, takes very long.

Under these conditions, the slowest tests typically last 500 hours. Therefore, the learning cycle time to improve a manufacturing process for interconnects is drastically limited by the time required for testing, each process change requiring several weeks of packaging and test before any assessment of its reliability performance.

Furthermore, it is to be noted that the determination of electromigration parameters $E_a$ and n corresponding to the different failure modes in a cumulative distribution requires that a significant number of samples are tested.

To obtain electromigration parameters according to the prior art, the MTF would have to be determined from resistance traces such as those shown in FIG. 1. The time-to-fail TTF corresponds to the time span required for reaching the step resistance-increase, as indicated in FIG. 1 by the dashed line indicating the time to failure TTF(L) for sample L. To obtain the electromigration parameters Ea and n, Black's equation would have to be used.

In the following, advantageous embodiments of an alternative electromigration testing method will be described. To that end, the description will first turn to the background of the electromigration testing method.

Figure 2:
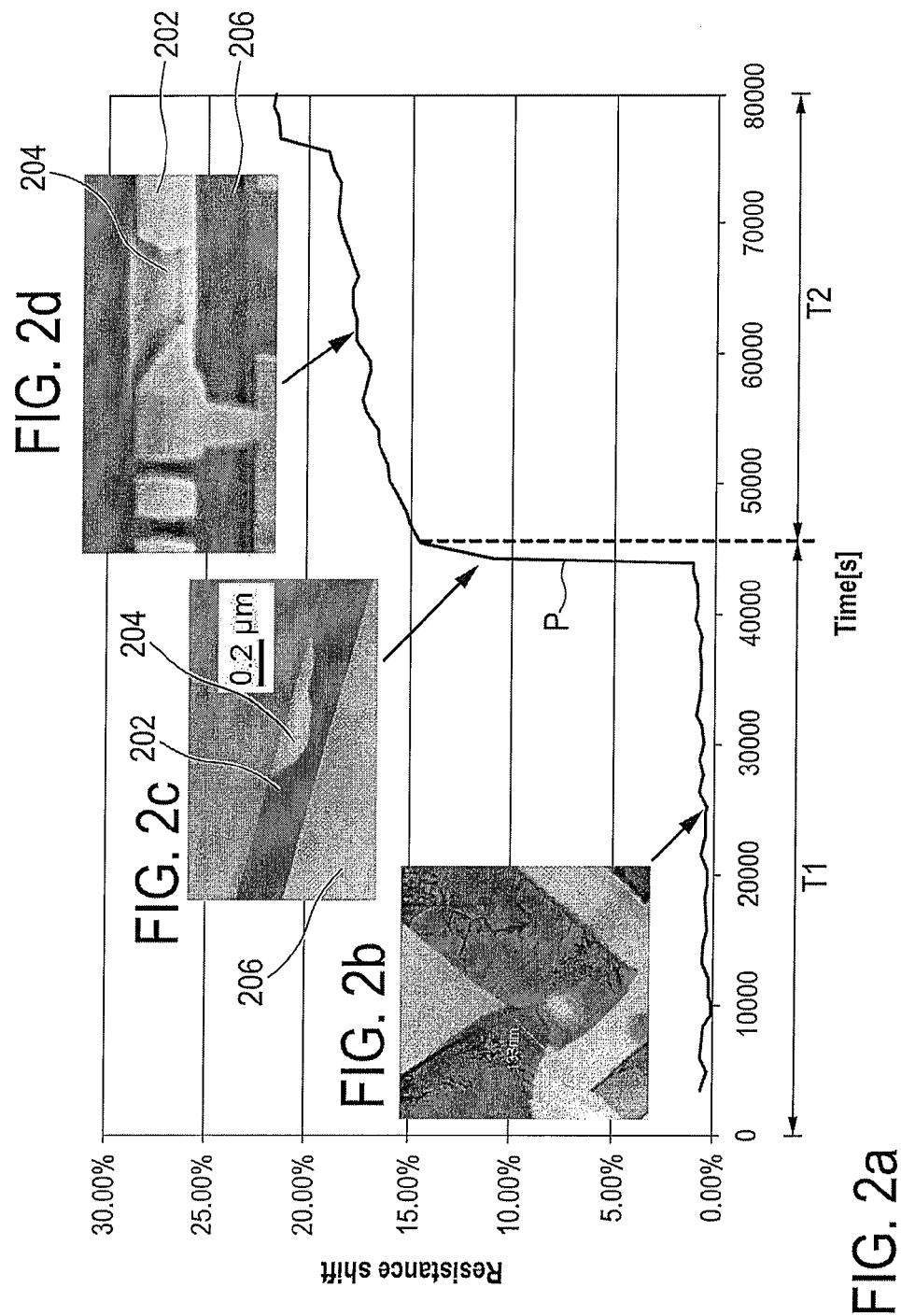
FIG. 2 shows a diagram illustrating the evolution of the electrical resistance for a single sample of an interconnect structure illustrated by exemplary scanning-electron microscopy micrographs, which show the degradation and formation of a void under continuing stress conditions.

FIG. 2a) is a schematic diagram showing the evolution of the electrical resistance for a single sample of an interconnect structure illustrated by exemplary scanning-electron microscopy micrographs given as insert FIGS. 2b), 2c), and 2d), which show the degradation and formation of a void under continuing stress conditions.

The diagram of FIG. 2a) and the micrographs of FIG. 2b) through FIG. 2d) serve to correlate the resistance evolution over time under a stress condition to the formation and evolution of a void in an interconnect structure. The interconnect structure is represented by the exemplary micrographs of interconnect structures in FIGS. 2b) through 2d). Note that the micrographs used in FIGS. 2b) to 2d) are taken from different samples with geometrically slightly different layer structures. The common features of the structures are best described with reference to the micrograph of FIG. 2c), which shows an interconnect structure with a metallization layer 202 that exhibits a void 204 with an irregular shape on an electrically conductive diffusion barrier layer 206, which may for instance be a TaN/Ta barrier as used in recent interconnect processing technologies. Identical reference numerals are used for the metallization layer 202, the void 204 and the electrically conductive diffusion barrier layer 206 in FIG. 2d)

The typical resistance evolution of a test sample, which is not one of the samples used in FIGS. 2b) to 2d), under stress conditions is shown by a resistance trace P in FIG. 2a). The duration of the experiment can be divided into two time spans that together result in a test time span for the sample or device under test (DUT) P. During a first time span T1, the resistance trace remains near the original resistance value. This correlates with a small void that does not affect the overall sample resistance. At the end of the first time span T1, a step resistance increase of nearly 15% after about 45 000 seconds is observed, the step-resistance-increase occurring within less than 5 000 seconds. The step resistance-increase is correlated to an initial formation of a void in the interconnect, as shown in FIG. 2b.

After the onset of void formation, the resistance trace exhibits a gradual increase during a second time span T2. During this second time span, the void has been formed and grows. The resistance increase after the step-resistance increase is progressive, and corresponds to a one-dimensional (1D) growth of a single void, electrical conduction being possible trough uncovered TaN/Ta Barrier, which forms a parallel connection with the metallization layer.

The resistance change ΔR corresponding to a one-dimensional growth of a single void can be calculated as follows.

$$\Delta R = \rho_b \cdot \frac{l_v}{w \cdot 2 \cdot t_b + 2 \cdot h \cdot t_b} \quad (5)$$

In this equation, $\rho_b$ is the resistivity of the material of the barrier (as one form of the second layer mentioned hereinabove), $l_v$ is the length of the void in the main current direction through the interconnect structure, $t_b$ is the layer thickness of the barrier layer, w is a lateral width of the metallization layer, as measured in a direction perpendicular to a main current direction through the interconnect structure, and h is the thickness of the metallization layer, as measured in a direction perpendicular to a main surface of the integrated circuit device.

The resistance change ΔR at any time after the step resistance-increase is explicitly related to the length of a void that occupies the entire trench cross section, i.e., uncovering the barrier layer. Furthermore, the resistance is also related to the length of the void when it grows under a stress condition. Thus it is possible to express ΔR in terms of the void length $l_v$.

The inventors measured the void length for a collection of samples tested at different temperatures, and for which the electrical resistance of the interconnect structure was known. The barrier resistance was then calculated from the uncovered barrier length, i.e., the void length. The result $\rho_b$=3 Ohm× micrometer was determined for different temperatures. The resistance of the barrier layer in the interconnect structure proved to be not temperature-dependent in the temperature range relevant for electromigration testing.

On the basis of known barrier properties, therefore, the depleted length $l_v$ of the first layer, in this example the metallization layer, under different stress conditions (current density, temperature) gives rise to different measurable resistance increase rates, which can be determined from the respective slopes of a resistance trace recorded during the electromigration testing.

For a given stress condition defined by temperature T and current density j, the depleted length depends on the stress condition as follows $$l_v(t) = A \cdot j \cdot \exp\left(-\frac{E_a}{kT}\right) \cdot t \quad (6)$$

wherein t denotes the time and k Boltzmann's constant. The time dependence of the depletion length is expressed in a time-constant factor A.

For an experimental verification of the method, it was determined whether the depletion rate, i.e., the resistance change rate, is dependent on the stress history, i.e., on the current density and temperature of previous stress time spans. However, this is not the case.

Furthermore, a comparison between values of the activation energy and of the current density exponent as obtained for comparable samples by either the direct evaluation of the measured TTF values according to the prior art or by the method of the invention resulted in equal results within the accuracy limits.

Figure 3:
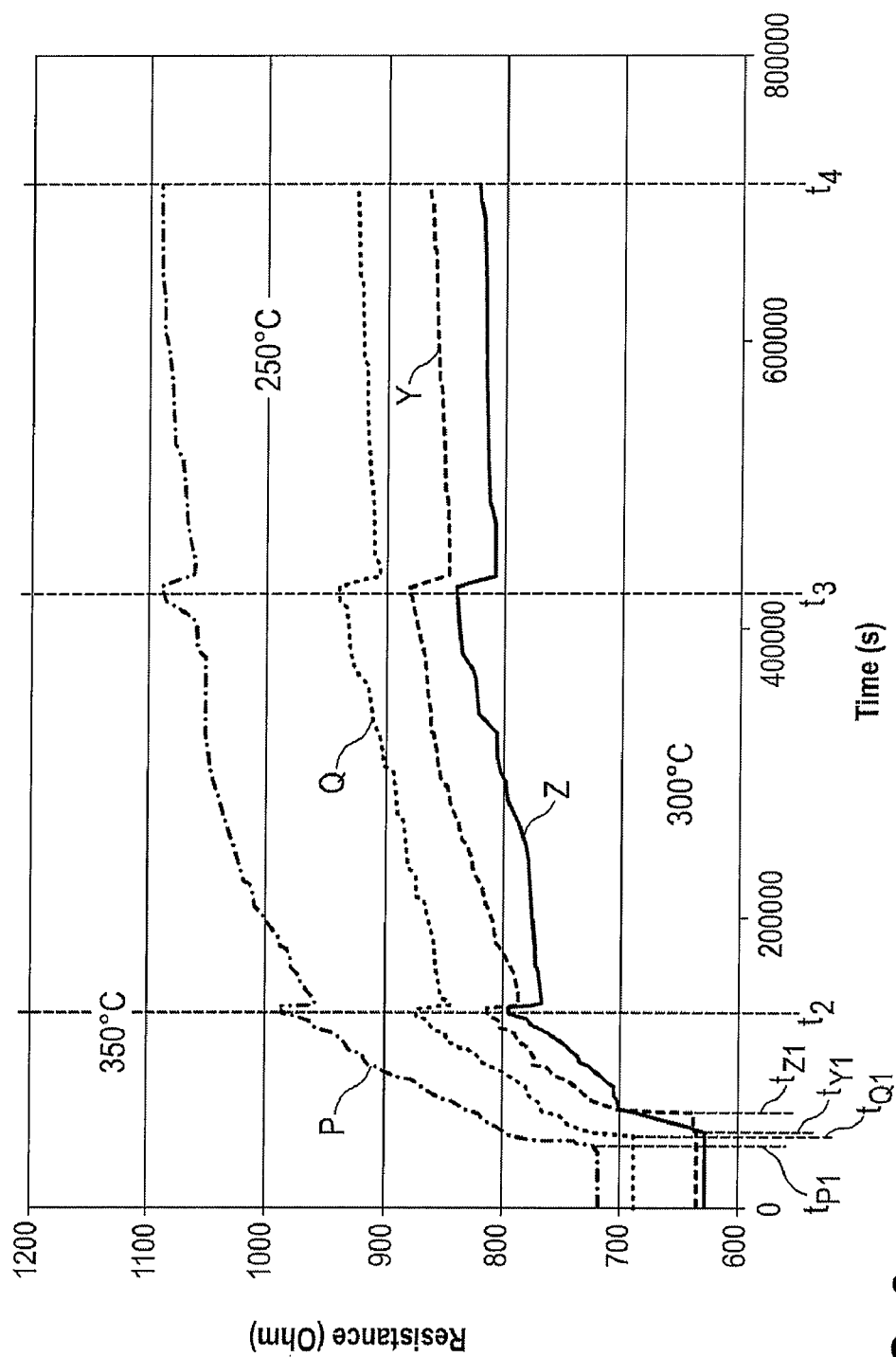
FIG. 3 shows measured resistance traces, which were ascertained by performing an embodiment of the method of the invention.

FIG. 3 shows measured resistance traces, which were ascertained by performing an embodiment of the method of the invention.

In the diagram of FIG. 3, the resistance in units of Ohm is plotted as a function of the time in units of seconds. Both, the resistance scale and the time scale have linear units.

The diagram of FIG. 3 shows four different resistance traces P, Q, Y, and Z. The traces P, Q, and Y were measured from four different devices under test, which for simplicity will also be referred to by the same capital letters P, Q, Y, and Z, corresponding to the respective resistance traces. All four samples were initially subjected to a first stress condition, as defined by a first electrical current density in the interconnect structure of the devices of the respective device under test and by a first temperature of the interconnect structure, which amounts to 350° C.

The four samples P, Q, Y, and Z exhibit respective step resistance-increases at different points in time, which are marked on the inserts by the labels $t_{P1}$, $t_{Q1}$, and $t_{Y1}$. Subsequently, the first stress conditions were maintained for a respective second time span, which extends from the respective times $t_{P1}$, $t_{Q1}$, and $t_{Y1}$ to the time $t_2$, which is labeled on the time axis of the diagram of FIG. 3. The first stress condition used up to these points in time comprises a temperature of the interconnect structure of the devices under test of T=350° C.

After detecting for each of the samples P, Q, Y, and Z that the resistance change after the step resistance-increase exceeded a predetermined relative threshold change amount, the temperature was changed at the time $t_2$, to 300° C. to apply a second stress condition. From there on, the resistance under this second stress condition was monitored until respective points in time $t_3$, where the temperature was lowered further to 250° C. to apply a third stress condition. The stress time span for the third stress condition defined by a certain current density and the temperature of T=250° C. thus is $t_3$-$t_2$. Subsequently, the resistance was monitored further under the third stress condition until reaching a time $t_4$.

As is clearly visible from the diagrams of FIG. 3, the slope of the resistance traces depends on the temperature applied during the respective stress time spans. Generally, the higher the temperature is, the higher is the slope of the resistance traces. A similar relation holds for the current density. It is also visible in FIG. 3 that the resistance traces undergo a step down at a temperature decrease when changing the stress condition. This is expected from the known temperature dependence of the resistance of metals such as copper.

Figure 4:
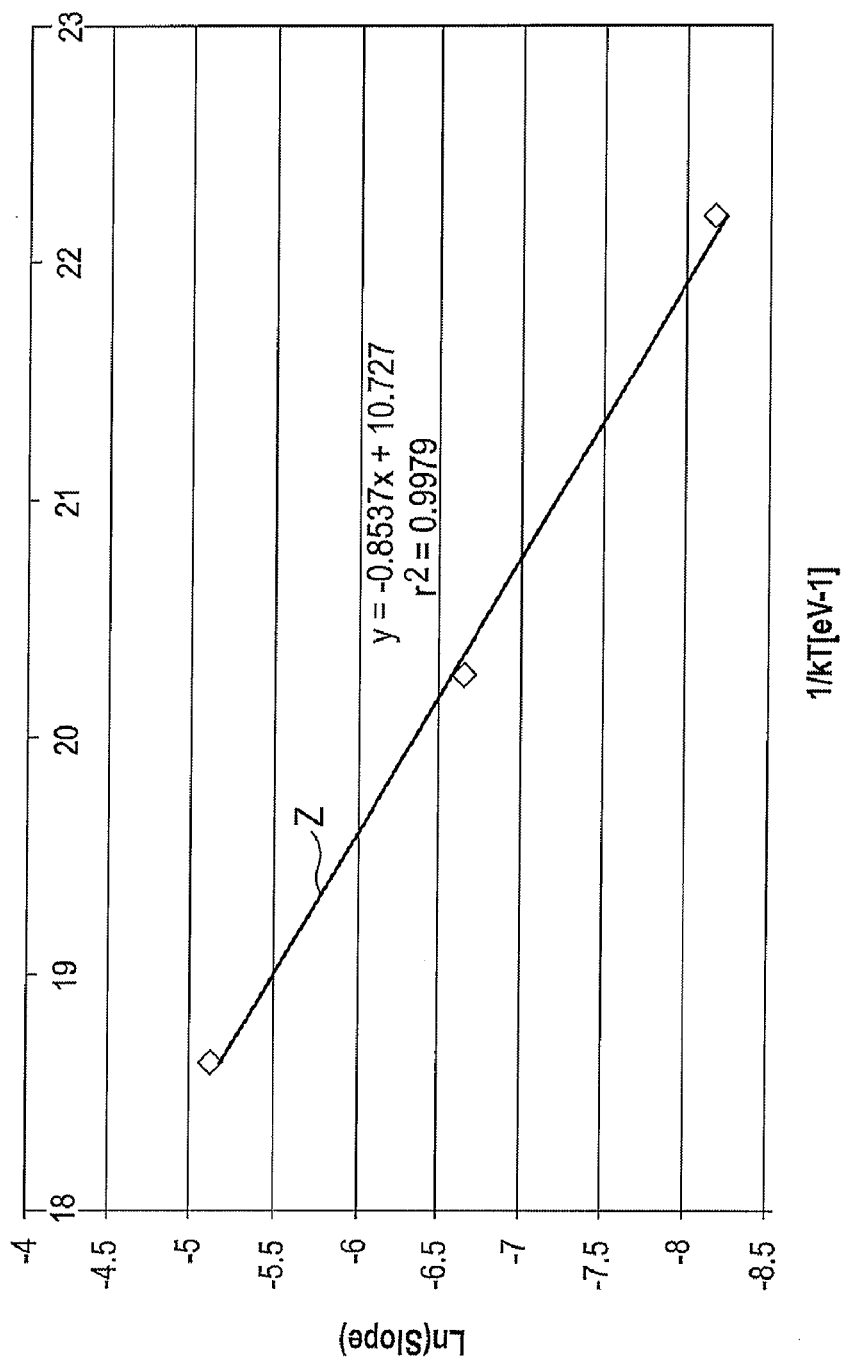
FIG. 4 shows a diagram that serves to prove the concept underlying the electromigration testing method of the present invention.

FIG. 4 is a diagram that serves to prove the concept underlying the electromigration testing method of the present invention. The diagram of FIG. 4 plots the natural logarithm of the slope of a resistance trace as a function of 1/kT. Both axes are linear. The plot thus represents an Arrhenius plot. From three different temperature values applied during the measurements, three different slopes were ascertained for plotting the diagram. As is clearly visible, the ascertained slopes are connected by a line with a negative slop in the Arrhenius plot of FIG. 4. The slope of the line Z in the Arrhenius plot corresponds to the activation energy according to equation (2). In the present example, the slop of the linear fit Z is −0.8537. The additive constant is 10.727. The reliability of the linear fit is expressed by a coefficient of determination, $r^2$, of 0.9979.

Figure 5:
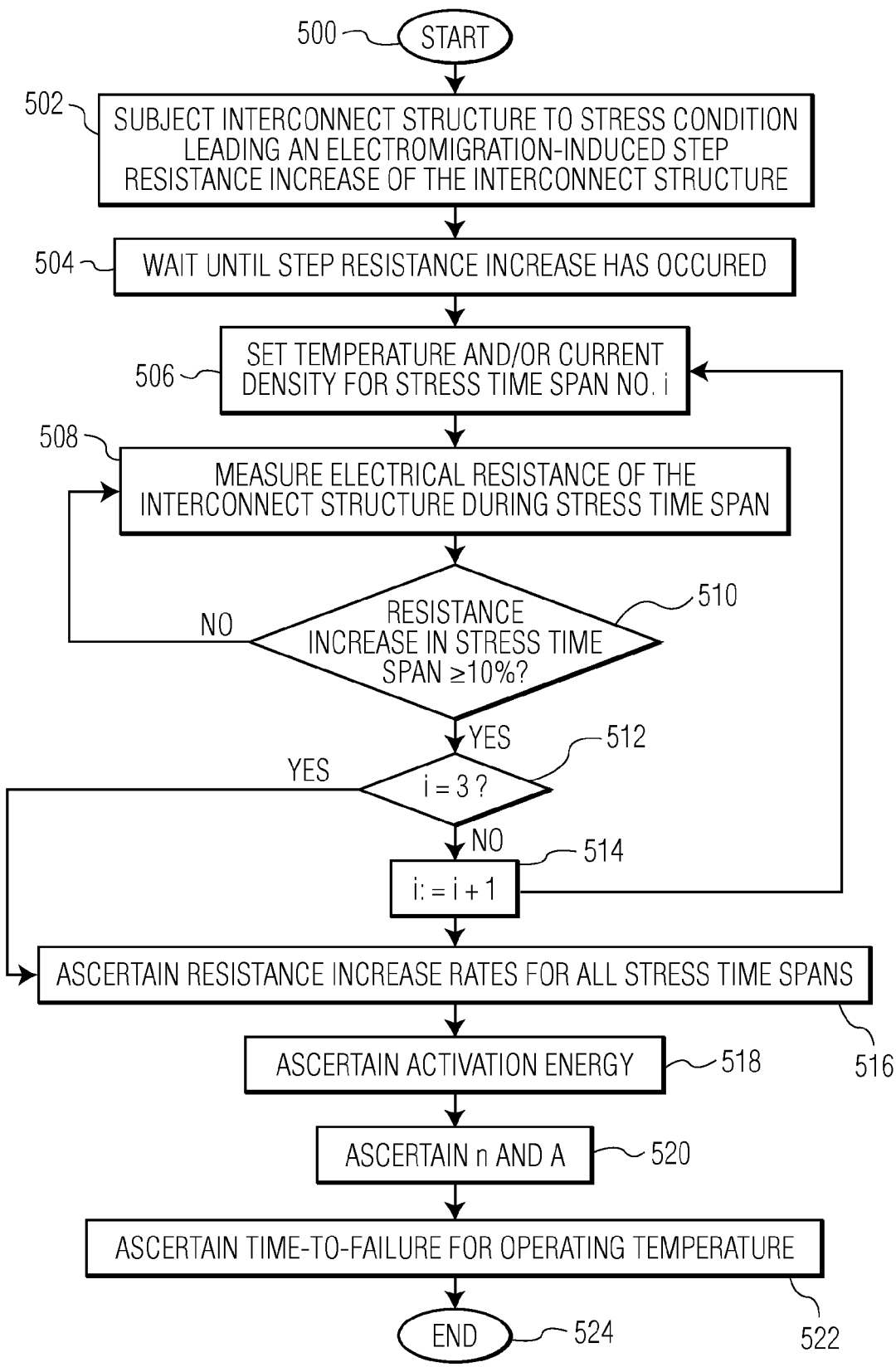
FIG. 5 shows a flow diagram of an electromigration testing and evaluation method for ascertaining an activation energy $E_a$, a current density exponent n, and a time-to-failure value for an operating temperature.

FIG. 5 is a flow diagram of a method for ascertaining an activation energy $E_a$, a current density exponent n, and a time-to-failure value for an operating temperature.

The method starts with a step 500. Then, in a step 502, a device under test is subjected to a stress condition. The stress condition is defined by a first electrical current density in an interconnect structure of the device under test, by a first temperature of the interconnect structure, and by a first stress time span. The first stress time span extends over a time interval, which is required to apply the first current density and the first temperature so as to force an electromigration-induced step resistance increase of the interconnect structure. The detection of a step resistance increase can be based on a criterion, according to which the resistance step must at least amount to 10% of the resistance value before the increase. Other criteria are possible. The criterion can also be based on an absolute resistance difference between the value before and after the step increase. The criterion can also be based on a slope of the resistance trace as measured over a predetermined floating time window.

In a step 504, the process waits until the step resistance increase has occurred. During this step, the resistance will typically be monitored to be able to observe the step resistance increase. The criterion can also be based on an absolute resistance difference between the value before and after the step increase. The criterion can also be based on a slop of the resistance trace as measured over a predetermined floating time window.

After having detected the step resistance increase, the method proceeds with setting a second stress condition differing from the first stress condition in the temperature and/or current density (step 506). The stress conditions set are maintained for a stress time span. During this time span, the electrical resistance trace is monitored continuously (step 508). It is checked whether the resistance increase in this stress time span has exceeded 10% (step 510). If the threshold of 10% of relative increase of the electrical resistance has been exceeded, the method proceeds to check whether three different stress conditions have already been applied after the step resistance increase (step 512). If this is not the case, the process branches back to step 506 after having increased an index value for the different stress conditions by one (step 514). Subsequently, the steps 508 to 512 are repeated until three different stress conditions have been applied after the step resistance increase. It is noted that in principle more stress condition could be used. However, since three different resistance increase rates are required for a unique solution, more stress conditions are not a requirement. Furthermore, the relative resistance increase threshold of 10% chosen in step 510 is only a suitable exemplary value. A higher relative resistance increase would lead to a longer measurement and enable a more accurate determination of the resistance increase rate during later steps. However, it is also possible to use a smaller threshold resistance increase than 10% in step 510 if the required accuracy is lower. A smaller threshold resistance increase has the advantage of allowing shorter stress time spans to be used.

After the set number of stress conditions have been applied to the device under test, the different resistance increase rates are determined from the recorded resistance trace for all stress conditions, i.e. all different stress time spans. The resistance increase rates correspond to the slopes of the resistance traces recorded during the application of the different stress conditions after the step resistance increase.

In an Arrhenius plot, which plots the natural logarithm of the resistance change rate as a function of 1/kT, the slope is negative and has the amount $E_a$, i.e., the value of the activation energy.

The geometrical parameters of the interconnect structure and of the underlying electrically conductive layer, which typically will be a diffusion barrier layer in the case of a copper interconnect structure, are readily known or derivable from the layout parameters of the interconnect structure and of the electrically conductive layer.

The foregoing method can by summarized in table form as follows:

| Step | |
|---|---|
| Step 500 | Start |
| Step 502 | Subject interconnect structure to stress condition leading an electromigration-induced step resistance increase of the interconnect structure |
| Step 504 | Wait until step resistance increase has occurred |
| Step 506 | Set temperature and/or current density for stress time span no. I |
| Step 508 | Measure electrical resistance of the interconnect structure during stress time span |
| Step 510 | Resistance increase in stress time span ≧10%? |
| Step 512 | i = 3? |
| Step 514 | i: = i + 1 |
| Step 516 | Ascertain resistance increase rates for all stress time spans |
| Step 518 | Ascertain activation energy |

| Step 520 | Ascertain n and A |
| Step 522 | Ascertain time-to-failure for operating temperature |
| Step 524 | End |

Figure 6:
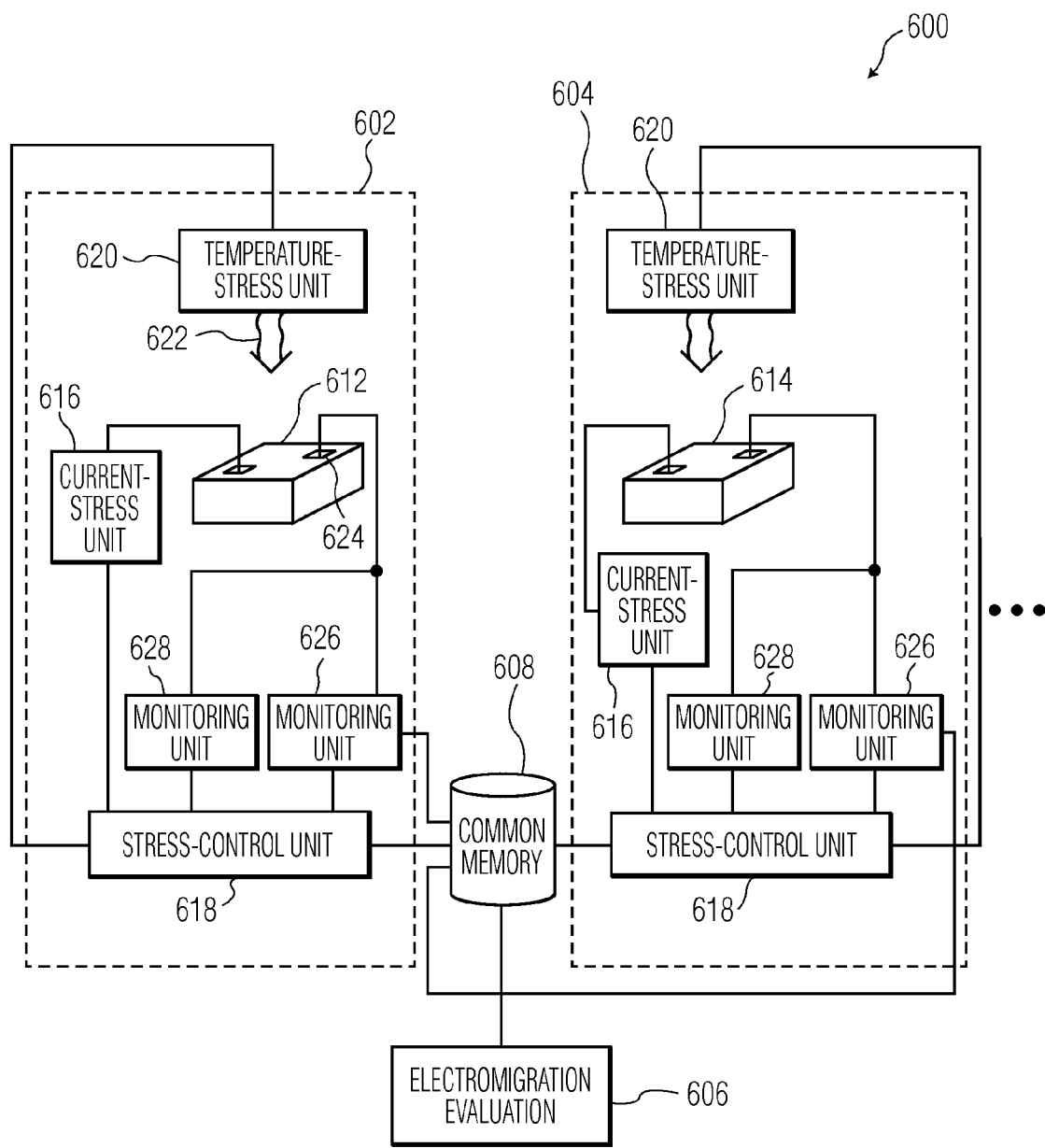
FIG. 6 shows a simplified block diagram of a system for electromigration testing and evaluation.

FIG. 6 shows a simplified block diagram of a system 600 for electromigration testing and evaluation. The system for electromigration 600 has a number of electromigration testing apparatus, two of them are labeled by reference numbers 602 and 604. Even if only two apparatus for electromigration testing are shown in FIG. 6, there may be a larger number, depending on the number of samples, which are to be tested. The system is modular and scalable, and can be extended by further individual apparatus for electromigration testing as those shown under reference labels 602 and 604.

Furthermore, the system has an apparatus for electromigration evaluation labeled with reference label 606. The system 600 uses a common memory 608, which can either be assigned to any of the individual electromigration testing apparatus or to the electromigration evaluation apparatus 606. It can also be a separate device, for instance in the form of a memory server.

Two devices under test 610 and 612 are schematically represented in FIG. 6 as being mounted in the respective electromigration testing apparatus. The following description will focus on the structure of the electromigration testing apparatus 602. Since both testing apparatus 602 and 604 are of identical structure, identical reference labels are used in FIG. 6 for identical functional units.

The device under test 612 is shown schematically as being connected to a current-stress unit 616. The current stress unit 616 serves to apply a predetermined current to the device under test 612, according to a predefined measurement program stored in the memory 608 and executed by a stress-control unit 618. The stress-control unit 618 has access to stress parameters for different stress conditions to be applied to the device under test. A temperature-stress unit 620 is configured to apply heat energy to the device under test 612, as indicated by an arrow 622, so as to set and maintain a temperature of the interconnect structure of the device under test 612 according to instructions received from the stress-control unit 618. A monitoring unit 626 has resistance sensor 624 is connected with the interconnect structure and configured and arranged to measure a quantity indicative of an electrical resistance of the device under test 612. The measured values of the first quantity are received by the monitoring unit 626 and a step-detector unit 628. Measured data is output from the monitoring unit to the memory 608 and stored therein.

During operation of the electromigration testing apparatus 602, the stress-control unit generates and outputs control signals so as to subject the interconnect structure of the device under test 612 to a first stress condition so as to force a electromigration-induced step resistance-increase of the interconnect structure. The step-detector unit detects the step resistance-increase, and thus triggers the start of a testing program, during which the interconnect structure is subjected to at least three predetermined respective stress conditions, as controlled by the stress-control unit 618 on the basis of parameter values stored in the memory 608. The stress conditions differ from each other in their value of the electrical current density and/or of the temperature. The stress-control unit uses the measured resistance data to determine the stress time spans used for the respective stress conditions. For instance, the stress time span can be selected according to a criterion that requires a relative resistance increase by a certain amount before switching to a different stress condition. This way, the accuracy of the electromigration testing can be controlled.

After performing the electromigration testing, all data collected in the memory 608 are evaluated. Resistance slopes are determined. From the resistance slopes ascertained for different stress conditions, the activation energy, the current density exponent n and an acceleration factor are determined by the evaluation unit 606.

The invention allows performing an electromigration test in much shorter time than known electromigration testing methods, without loss of information or accuracy. It is therefore possible to accelerate the optimization of the interconnect manufacturing process so that the conductor electromigration kinetics remains compatible with a required product lifetime. This allows reducing the time and cost for electromigration testing and thus fabricating integrated-circuit devices with a lower overall cost.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A unit may fulfill the functions of several items recited in the claims. The mere fact that certain measures are recited in mutually different dependent claims does not indicate that a combination of these measured cannot be used to advantage.

Any reference signs in the claims should not be construed as limiting the scope.

The invention claimed is:

1. An electromigration testing method for a device under test with an interconnect structure, comprising the steps:
    subjecting, for a first stress time span, the interconnect structure to a first stress condition, which comprises a first electrical current density in the interconnect structure and a first temperature of the interconnect structure, so as to force occurrence of a step resistance-increase of the interconnect structure due to electromigration in a first layer of the interconnect structure; and
    subjecting the interconnect structure to at least three respective predetermined stress conditions, which differ from each other in their value of the electrical current density in the interconnect structure or of the temperature of the interconnect structure, for at least three respective stress time spans after the occurrence of the step resistance-increase, and concurrently measuring a test quantity indicative of an electrical resistance of the interconnect structure,
    wherein
    the first temperature value of the first stress condition is higher than any of the temperature values used in the stress conditions after occurrence of the step-resistance increase, and
    the first current density value of the first stress condition is higher than any of the current density values used in the stress conditions after occurrence of the step-resistance increase.

2. The method of claim 1, wherein
subjecting the interconnect structure to at least three stress conditions after the occurrence of the step resistance-increase comprises subjecting it to at least three different temperature values.

3. The method of claim 1, wherein
subjecting the interconnect structure to at least three stress conditions after the occurrence of the step resistance-increase comprises varying the current density and maintaining a fixed temperature value for at least two stress conditions.

4. The method of claim 1, further comprising
performing the method for a plurality of devices under test in parallel.

5. The method of claim 4, further comprising
measuring respective time-to-fail values for the devices under test as the respective time spans from a beginning of the first stress time span to the occurrence of the electromigration-induced step resistance-increase of the interconnect structure.

6. The method of claim 4, further comprising
performing the method on different electromigration testing apparatus in parallel;
providing measured test quantity values obtained from the plurality of samples from the different electromigration testing apparatus to a single evaluation stage.

7. A method for electromigration evaluation of a device under test with an interconnect structure, comprising the steps:
providing measurement data of a test quantity indicative of an electrical resistance of the interconnect structure obtained by performing an electromigration testing method according to claim 1;
providing data indicative of applied stress conditions and respective stress time spans used in performing the electromigration testing method according to claim 1;
ascertaining respective change rates of the electrical resistance of the interconnect structure of the device under test under the at least three respective stress conditions applied during the at least three respective stress time spans after the occurrence of the step resistance-increase.

8. The method of claim 7, further comprising
ascertaining an activation energy of electromigration-induced conductor-material diffusion from the change rates of the test quantity as a function of the testing temperature or as a function of the current density.

9. The method of claim 8, further comprising
ascertaining or providing, for the device under test, data indicative of
a resistivity $\rho_b$ of the material of a second layer in a parallel connection of electrical resistances in the form of an electrically conductive first layer and an adjacent electrically conductive second layer,
a layer thickness $t_b$ of the second layer,
a lateral width w of the first layer, as measured in a direction perpendicular to a main current direction through the interconnect structure, and
a layer thickness h of the first layer, as measured in a direction perpendicular to a main surface of the integrated circuit device.
wherein the step of ascertaining the activation energy of electromigration-induced conductor-material diffusion comprises calculating the activation energy on the basis of the following relation:

$$\ln\left(\frac{\Delta R}{\Delta t}\right) = \ln\rho_b + \ln A + \ln j - \ln(w \cdot 2 \cdot t_b + 2 \cdot h \cdot t_b) - \ln\Delta t + \frac{-E_a}{kT},$$

from the change rates determined for the at least three respective different stress conductions after the step resistance-increase,
wherein $$\frac{\Delta R}{\Delta t}$$

is a resistance change rate in a respective stress time span $\Delta t$, A is a constant, j is the current density in the interconnect structure, $E_a$ is the activation energy, k is Boltzmann's constant, and T is the temperature of the interconnect structure.

10. A computer program product, carrying a computer program embodied in a non-transitory computer readable medium adapted to perform an electromigration evaluation method according to claim 7 when implemented on a computer.

11. The method of claim 7, further comprising
ascertaining a mean time-to-failure from measured time-to-fail values of the devices under test; and
ascertaining a current-density exponent n according to Black's equation from the change rates of test quantity as a function of the current density and the ascertained activation energy for the fixed temperature value.

12. An apparatus for electromigration evaluation of a device under test, the apparatus being configured to:
receive measurement data of a test quantity indicative of an electrical resistance of the interconnect structure obtained by performing an electromigration testing method according to claim 1;
receive data indicative of applied stress conditions and respective stress time spans used in performing the electromigration testing method according to claim 1; and to
ascertain respective change rates of the electrical resistance of the interconnect structure of the device under test under the at least three respective stress conditions applied during the at least three respective stress time spans after the occurrence of the step resistance-increase.

13. A computer program product, carrying a computer program embodied in a non-transitory computer readable medium adapted to perform an electromigration testing method according to claim 1 when implemented on a computer.

14. An apparatus for electromigration testing of a device under test, the apparatus being configured to:
subject, for a first stress time span, the interconnect structure to a first stress condition, which is defined by a first electrical current density in the interconnect structure and a first temperature of the interconnect structure, so as to force an electromigration-induced step resistance-increase of the interconnect structure; and to
subject the interconnect structure to at least three predetermined respective stress conditions, which differ from each other in their value of the electrical current density or of the temperature, for at least three respective stress time spans after the occurrence of the step resistance-increase,
wherein the apparatus comprises:
a step-detector unit, which is configured to detect a change of the first quantity corresponding to a step resistance-increase and to provide at its output a trigger signal indicative of the occurrence of the step resistance-increase; and
a stress-control unit, which has an input connected with the step-detector unit and which is configured to generate and provide at its output, after having received the trigger signal, respective stress-control signals for setting or maintaining the respective predetermined electrical currents and for setting or maintaining a respective predetermined temperatures for the respective stress time spans after the occurrence of the step resistance-increase.

15. The apparatus of claim 14, further comprising
a monitoring unit, which is configured to measure a test quantity indicative of an electrical resistance of the interconnect structure,
wherein the stress-control unit is connected with the monitoring unit and configured to detect whether the test quantity has changed by a predetermined relative threshold change amount since the beginning of a respective stress time span, and to provide respective stress-control signals for changing from one stress condition to another stress condition after detecting that the step resistance predetermined relative threshold change amount has been reached or exceeded.

16. An electromigration testing method for a device under test with an interconnect structure, comprising the steps:
subjecting, for a first stress time span, the interconnect structure to a first stress condition, which comprises a first electrical current density in the interconnect structure and a first temperature of the interconnect structure, so as to force occurrence of a step resistance-increase of the interconnect structure due to electromigration in a first layer of the interconnect structure;
subjecting the interconnect structure to at least three respective predetermined stress conditions, which differ from each other in their value of the electrical current density in the interconnect structure or of the temperature of the interconnect structure, for at least three respective stress time spans after the occurrence of the step resistance-increase, and concurrently measuring a test quantity indicative of an electrical resistance of the interconnect structure;
detecting that the test quantity exhibits a relative change higher than a threshold relative-change within a time window extending from a respective present point in time back for a predetermined time span; and
either stopping the electromigration testing or changing to a next stress condition for continuing the electromigration testing, depending on whether a preset number of stress conditions has been reached or not.

17. The method of claim 16, wherein
subjecting the interconnect structure to at least three stress conditions after the occurrence of the step resistance-increase comprises subjecting it to at least three different temperature values.

18. The method of claim 16, wherein
subjecting the interconnect structure to at least three stress conditions after the occurrence of the step resistance-increase comprises varying the current density and maintaining a fixed temperature value for at least two stress conditions.

19. The method of claim 16, further comprising
performing the method for a plurality of devices under test in parallel.

20. The method of claim 19 further comprising
measuring respective time-to-fail values for the devices under test as the respective time spans from a beginning of the first stress time span to the occurrence of the electromigration-induced step resistance-increase of the interconnect structure.

* * * * *